(12) United States Patent
Misic (10) Patent No.: US 6,396,273 B2
(45) Date of Patent: May 28, 2002

(54) MAGNETIC RESONANCE IMAGING RECEIVER/TRANSMITTER COILS

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 09/776,132

(22) Filed: Feb. 2, 2001

Related U.S. Application Data (60) Continuation of application No. 09/512,093, filed on Feb. 24, 2000, which is a division of application No. 08/979,842, filed on Nov. 26, 1997, now Pat. No. 6,040,697.

(51) Int. Cl.⁷ ................................................ G01V 3/00
(52) U.S. Cl. ...................................... 324/318; 324/322
(58) Field of Search ............................... 324/318, 322, 324/300, 306, 307, 309

(56) References Cited

U.S. PATENT DOCUMENTS

| | | | |
|---|---|---|---|
| 4,411,270 A | 10/1983 | Damadian | 128/653 |
| 4,467,282 A | 8/1984 | Siebold | 324/309 |
| 4,707,664 A | 11/1987 | Fehn et al. | 324/322 |
| 4,793,356 A | 12/1988 | Misic et al. | 128/653 |
| 4,825,162 A | 4/1989 | Roemer et al. | 324/318 |
| 4,923,459 A | 5/1990 | Nambu | 606/130 |
| 5,258,717 A | 11/1993 | Misic et al. | 324/318 |
| 5,543,711 A | 8/1996 | Srinivasan et al. | 324/318 |
| 5,559,434 A | 9/1996 | Takahashi et al. | 324/318 |
| 5,621,323 A * | 4/1997 | Larsen | 324/318 |
| 5,646,531 A | 7/1997 | Renz | 324/318 |
| 5,696,449 A * | 12/1997 | Boskamp | 324/318 |
| 6,040,697 A | 3/2000 | Misic | 324/318 |
| 6,150,816 A * | 11/2000 | Srinivasan | 324/318 |
| 6,177,797 B1 * | 1/2001 | Srinivasan | 324/318 |

FOREIGN PATENT DOCUMENTS

| | | | |
|---|---|---|---|
| EP | 0 758 091 A1 | 2/1997 | G01R/33/34 |
| WO | WO 98/37438 | 8/1998 | G01V/3/00 |

OTHER PUBLICATIONS

P.B. Roemer et al., "The NMR Phased Array", Magnetic Resonance in Medicine 16, Copyright 1990 academic Press, Inc., pp. 192–225.

Requardt, H. et al., "Switched Array Coils", Magnetic Resonance In Medicine, vol. 13, Mar. 1990, No. 3, pp. 385–397, XP 000132470.

Duensing R. et al., "A Continuously Variable Field of View Surface Coil", Magnetic Resonance in Medicine, vol. 13, 1990, No. 3, 1990, No. 3, pp. 378–384, XP 000132469.

* cited by examiner

*Primary Examiner*—Louis Arana
(74) *Attorney, Agent, or Firm*—Matthew J. Sampson; Gregory L. Bradley (57) ABSTRACT

A magnetic resonance imaging receiver/transmitter coil system for providing images for regions of interest includes a first phased array formed of a plurality of electrically conductive members and defining an array volume and a second phased array formed of a second plurality of electrically conductive members and disposed at least partially within the defined array volume. At least one of the first and second phased arrays is adapted to apply a magnetic field to the defined array volume. At least one of the first and second phased arrays is further adapted to receive said applied magnetic field. The first phased array is extendible to define a further array volume and is provided with a switch for electrically coupling and decoupling an extension to effectively extend the length of the first phased array and thereby define the further array volume. In this manner the length of the first phased array is effectively extended to approximately twice its unextended length.

25 Claims, 6 Drawing Sheets

MAGNETIC RESONANCE IMAGING RECEIVER/TRANSMITTER COILS

CROSS-REFERENCE TO RELATED APPLICATION

This is a continuation of application Ser. No. 09/512,093 filed Feb. 24, 2000, which, application is a divisional of application Ser. No. 08/979,842, filed on Nov. 26, 1997, now U.S. Pat. No. 6,040,697 the contents of which are hereby incorporated by reference.

BACKGROUND OF THE INVENTION

The present invention relates to the field of magnetic resonance imaging (MRI) systems and, more particularly, to coils for use in such systems.

It is well known in the field of MRI systems to provide radio frequency signals in the form of circularly polarized or rotating magnetic fields having an axis of rotation aligned with a main magnetic field. It is also well known to use receiving coils to intercept a radio frequency magnetic field generated by a human subject or an object in the presence of the main magnetic field in order to provide an image of the human subject or the object.

Receiving coils of this type were formed as volume coils in order to enclose a volume for receiving a body part such as a leg, arm or hand and intercept the radio magnetic field. See, for example, U.S. Pat. Nos. 4,411,270 issued to Demadian and 4,923,459 issued to Nabu. Additionally, surface receiving coils were developed for this purpose. The surface receiving coils were placed adjacent a region of interest. For a surface receiving coil, see U.S. Pat. No. 4,793,356 to Misic et al. for example.

Advances in the field of MRI systems have resulted in modifications to both volume receiving coils and surface receiving coils in order to improve their signal to noise ratios. This was achieved by modifying the receiving coils to receive perpendicular components of the radio frequency magnetic field. These improved coils are known as quadrature coils. Quadrature coils provided a significant signal to noise ratio improvement over non-quadrature coils. See, for example, U.S. Pat. Nos. 4,467,282 issued to Siebold and 4,707,664 issued to Fehn.

In U.S. Pat. No. 5,258,717, issued to Misic, a quadrature receiving coil system was provided, along with a data acquisition system. The data acquisition system taught by Misic included multiple image processing channels for processing a plurality of MRI signals and combining the processed signals to produce an image. The receiving coil system of Misic was formed of multiple quadrature receiving coils, the receiving coils being adapted to intercept both of the quadrature components of the magnetic resonance signals in a spatially dependent manner. Such quadrature coil systems provided coverage of a portion of a total target sensitive volume along an axis parallel to the main magnetic field. Consequently, each receiving coil of the system had a sensitive volume smaller than that which would otherwise be necessary. Thus, each receiving coil provided an improved signal to noise ratio for the region within its sensitive volume. Two leads were connected to each receiving coil and each lead was connected to a separate processing channel of the data acquisition system. The outputs of the processing channels were combined and a final data set from the entire target sensitive volume was calculated. The calculated data set had a better signal to noise ratio greater than that which could be achieved with a single receiving coil.

However, the various receiving coils of the prior art described had a number of artifact problems. For example, an image provided using the prior art receiving coils could have artifacts due to aliasing caused when the phase of a signal from a part of the anatomy within the field of the coil duplicates that of a location elsewhere. This occurs because a phase location of 370 degrees appears to the system as a phase locations of 10 degrees. Thus a signal from anatomy at a phase location of −350 or 370 degrees manifests itself in the image at a phase location of 10 degrees within the field of view. Elimination of phase wrap essentially halves the actual phase field of view, shifting from −90 to +90 degrees rather than from −180 to +180 degrees. However, this merely moves the alias location to more than +/−1.5 the field of view rather that eliminating it.

Another form of artifact, sometimes referred to as an annafact, can occur in either the frequency direction or the phase direction within prior art MRI systems. In this type of artifact an area of anatomy that is at least partially within the excitation field of the body coil has a local Larmour frequency identical to a pixel within the imaging field of view. If there is any excitation and subsequent pickup of this material it appears within the field of view superimposed upon the desired image, regardless of whether the artifact comes in from the frequency direction or the phase direction. The problems associated with this type of artifact are worsened by the use of higher speed gradients that are shorter in physical size and lower field uniformity.

An object of the invention therefore is to provide a method that eliminates soft tissue artifacts and aliasing artifacts that are created by prior art methods for imaging various regions of interest.

Another object of the present invention is to provide improved signal to noise performance, for example, by permitting the use of smaller fields of view and thinner slices when performing imaging.

Another object of the present invention is to provide greater image uniformity than provided in the prior art.

Another object of the invention is to facilitate complete magnetic resonance imaging of regions of interest.

SUMMARY OF THE INVENTION

A magnetic resonance imaging receiver/transmitter coil system for providing images for regions of interest includes a first phased array coil element formed of a plurality of electrically conductive members and defining an array volume and a second phased array coil element formed of a second plurality of electrically conductive members and disposed at least partially within the defined array volume. At least one of the first and second phased arrays is adapted to apply a magnetic field to the defined array volume. At least one of the first and second phased arrays is further adapted to receive said applied magnetic field. The first phased array is extendible to define a further array volume and is provided with a switch for electrically coupling and decoupling an extension to effectively extend the length of the first phased array and thereby define the further array volume. In this manner the length of the first phased array is effectively extended to approximately twice its unextended length.

DETAILED DESCRIPTION OF THE PRESENTLY PREFERRED EMBODIMENTS

Figure 1:
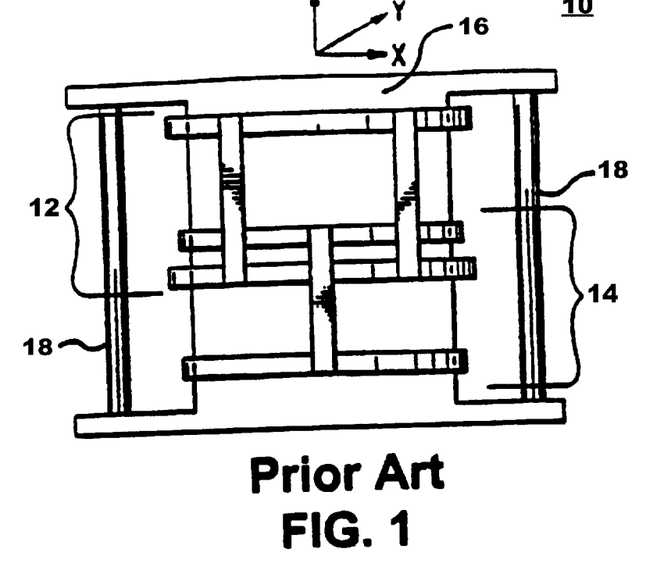
FIG. 1 is a side view of a prior art multiple quadrature receiving coil system wherein each coil of the quadrature coil system is a birdcage coil.
Figure 2:
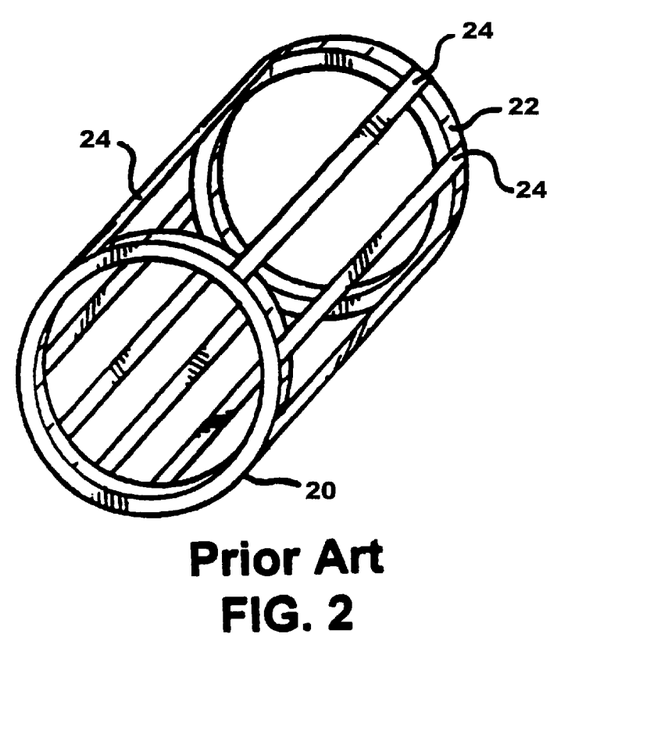
FIG. 2 is a perspective view of a single quadrature birdcage coil forming part of the prior art multiple quadrature receiving coil system of FIG. 1.

Referring now to FIGS. 1 and 2, there is shown prior art multiple quadrature receiving coil system 10. Prior art multiple quadrature receiving coil system 10 was formed of quadrature receiving coils 12, 14 designed for a variety of anatomical regions of the body, such as the knee, leg, arm or head. Quadrature receiving coils 12, 14 of quadrature receiving coil system 10 are thus volume coils. Coils 12, 14 are disposed around hollow cylindrical drum support member 16. Support rods 18 extending the length of cylindrical drum 16 can be provided to stabilize cylindrical drum support member 16.

Quadrature receiving coils 12, 14 are of a type referred to as birdcage coils, as well known in the art. They are formed of circular conductive loops 20, 22 connected to each other and spaced apart from each other by conductive connection members 24. There may be eight electrically conductive connection members 24 or rods 24 joining circular conductive loops 20, 22. Each receiving coil 12, 14 of coil system 10 formed in this manner can function as a separate quadrature receiving coil within coil system 10.

Magnetic interaction between quadrature receiving coils 12, 14 is eliminated by positioning quadrature coils 12, 14 about drum support member 16 to provide radial symmetry about the axis parallel to the main magnetic field, which is the Z-axis shown in FIG. 1. Moreover, quadrature coil 12 is slightly larger in diameter than quadrature coil 14 so that coil 12 can overlap a portion of coil 14. The amount of overlap of coils 12, 14 is adjusted so that the net flux from one coil, as seen as the vector sum of the flux from the overlap region, exactly cancels the flux from the return through the balance of the coil. In this case the field vector of the overlap region can be substantially equal to the field vectors of the other two regions. This causes the net shared flux of zero and thus a net mutual inductance of zero between quadrature receiving coils 12, 14. Coils 12, 14 maintain their isolation regardless of the relative rotational position about their common axis.

Quadrature coils 12, 14 of receiving coil system 10 have symmetry about two planes parallel to the Z-axis. The two planes of symmetry are at right angles to each other. In addition, quadrature coils 12, 14 are arranged so that the rotating magnetic vector of each receiving coil 12, 14 is in the X-Y plane. However, the net rotating magnetic vectors of coils 12, 14 are spatially displaced from each other along the Z-axis. In this regard, each receiving coil 12, 14 intercepts the quadrature components of the magnetic resonance signal within its own sensitive volume.

Figure 3:
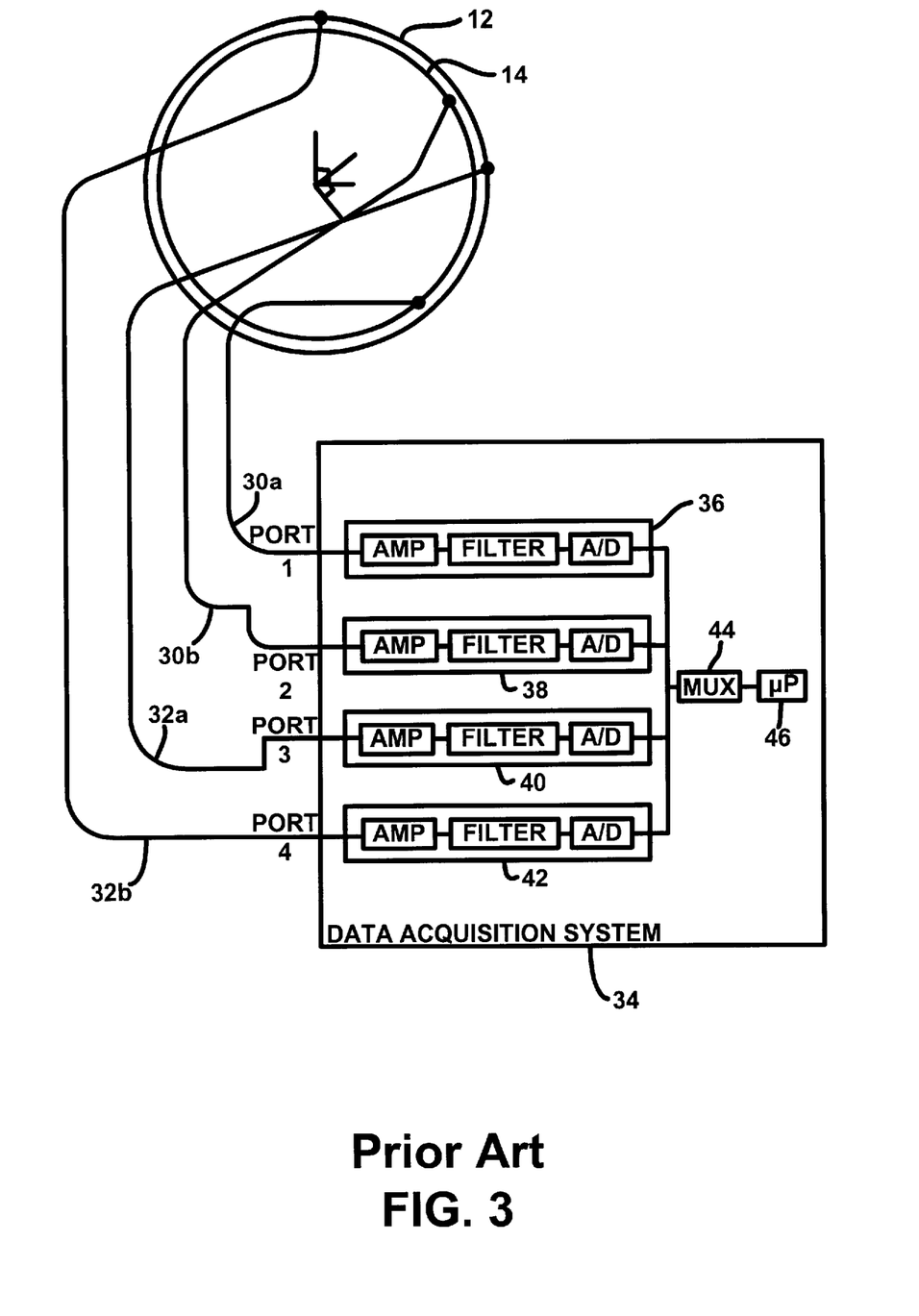
FIG. 3 is a schematic diagram illustrating possible electrical connections of the prior art multiple quadrature receiving coil system of FIG. 1.

Referring now to FIG. 3, there is shown a schematic representation of electrical connections that can be made to quadrature receiving coils 12, 14 of prior art quadrature receiving coil system 10. In this system a plurality of electrical leads 30a, b are connected to quadrature coil 14 and a plurality of electrical leads 32a, b are connected to quadrature coil 12. In the preferred embodiment electrical leads 30a, b and 32a, b are coaxial leads. Each coaxial lead 30a, b and 32a, b thus includes a center conductor and a shield, as is well known in the art. Each coaxial lead 30a, b and 32a, b coupled to quadrature coils 12, 14 is connected to a respective port 1-4 of data acquisition system 34 by its pair of coaxial electrical leads. Data acquisition system 34 is described in an article by Roemer et al., entitled "The NMR Phased Array," *Magnetic Resonance in Medicine*. Vol. 16 (1990), pp. 192–225. System 34 is provided with multiple data processing channels 36–42. Each data processing channel 36–42 includes an individual amplifier, filter, and A/D converter for processing the image signals received by a corresponding coaxial lead 30a, b or 32a, b. The outputs of data processing channels 36–42 are multiplexed by multiplexer 44 and combined by microprocessor 46 according to a weighting algorithm. The weighting algorithm is adapted to select the outputs of processing channels 36–42 and combine them to produce an overall image signal. For example, a combined image signal having a maximum signal to noise ratio can be provided by the weighting algorithm performed by microprocessor 46.

Coaxial leads 30a, b are connected to quadrature coil 12 at points that are at ninety degrees relative to each other and to ports 1, 2 of data acquisition system 34. Likewise, coaxial leads 32a, b are connected to quadrature coil 14 at points that are disposed at ninety degrees relative to each other. Coaxial leads 32a, b are also connected to ports 3, 4 of data acquisition system 34. An electrical network (not shown) can be interconnected between quadrature receiving coils 12, 14 and coaxial leads 30a, b and 32a, b to appropriately connect the cables to quadrature coils 12, 14. Such electrical networks are well known in the art. Furthermore, quadrature coils 12, 14 can be rotated relative to one another without destroying the signal to noise improvements achieved in accordance with this prior art method which is taught in U.S. Pat. No. 5,258,717 and incorporated by reference herein.

Figure 4:
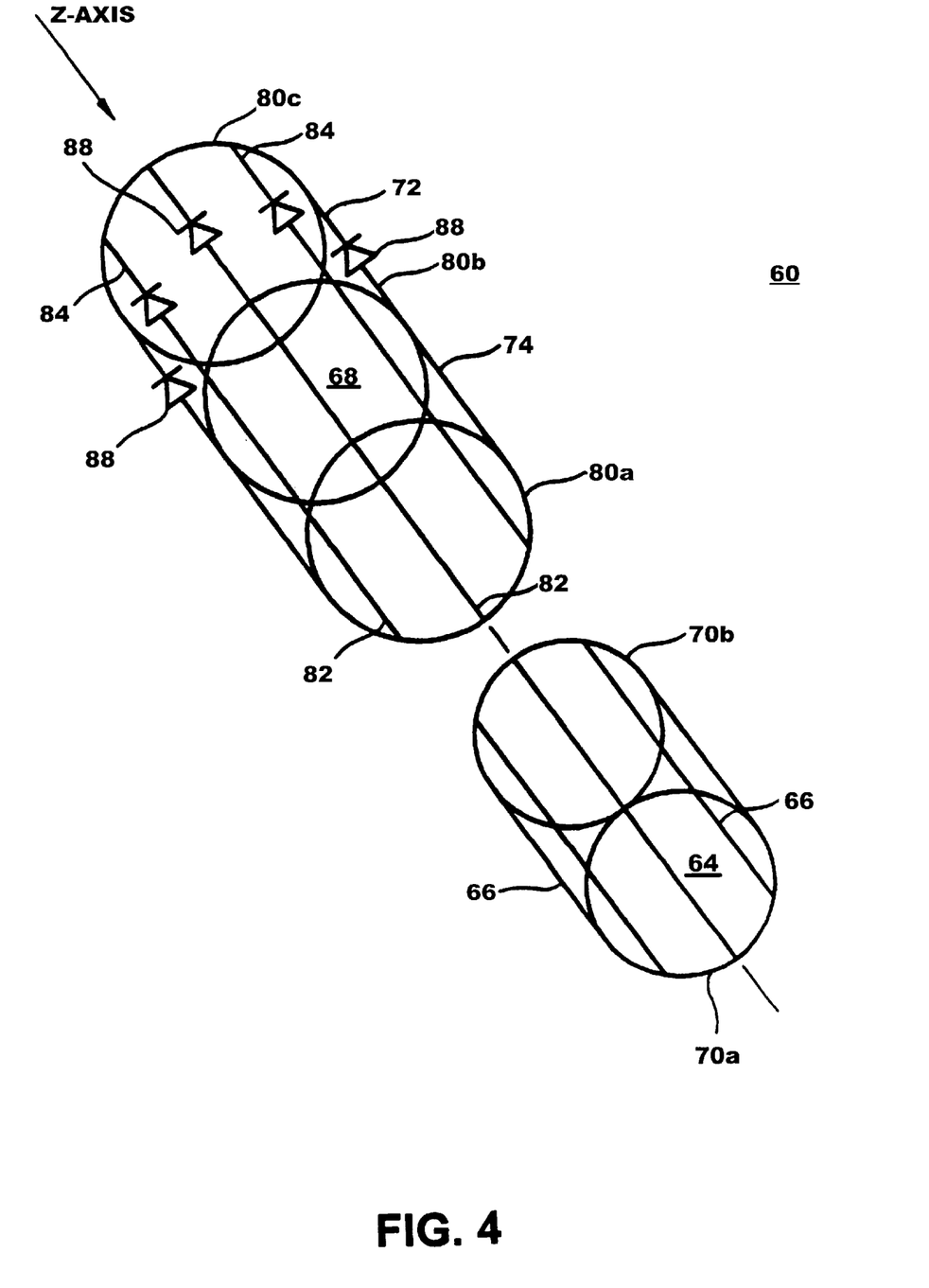
FIG. 4 is an exploded perspective view of a first preferred embodiment of the multiple quadrature receiver/transmitter coil system of the present invention.

Referring now to FIG. 4. there is shown an embodiment of the magnetic receiver/transmitter coil array system 60 of the present invention. Transmit/receive coil array system 60 can be formed of two quadrature birdcage coils: outer quadrature coil 68 and inner quadrature coil 64. Inner quadrature coil 64 can be disposed partially within the volume defined by outer quadrature coil 68 wherein quadrature coils 64, 68 can be provided with a critical overlap to reduce the mutual inductance therebetween and to therefore reduce the signal coupling between the coils 64, 68 to a negligible level, in a manner substantially as described for coil array system 10. In one possible preferred embodiment of coil array system 60 inner quadrature coil 64 can have a diameter of approximately 19.4 centimeters and outer quadrature coil 68 can have a diameter of approximately 22.5 centimeters. While coil array system 60 is shown in an exploded view for purposes of illustration it will be understood that inner quadrature coil 64 is disposed within outer quadrature coil 68 during normal operation of coil array system 60.

In the preferred embodiment of coil array system 60 (as discussed in more detail below with respect to FIG. 6) inner coil 64 can be formed with eight electrically conductive rods 66 fixed to electrically conductive end rings 70$a,b$. Outer quadrature coil 68 can be formed of two sections: receive/ transmit coil section 74 and auxiliary transmit coil section 72. Receive/transmit section 74 can be provided with eight electrically conductive rods 82 fixed to electrically conductive end rings 80$a,b$ which act cooperatively to define an array volume. Auxiliary transmit coil section 72 can be provided with eight electrically conductive rods 84 connecting electrically conductive end rings 80$b,c$. Rods 66, 82 and 84 as well as end rings 70$a,b$ and 80$a,b,c$ can be any kind of electrical conductors such as, for example, conductive tubing, etched copper or copper tape or any other material suitable for inducing and detecting a magnetic field.

Furthermore, each conductive rod 84 of auxiliary transmit coil section 72 can be provided with a PIN diode 88. When PIN diodes 88 of auxiliary coil 72 are forward biased conductive rods 84 and 80$c$ are electrically coupled to receive/transmit coil section 74. Thus PIN diodes 88 can couple and decouple portions of rods 84 and thereby substantially couple and decouple transmit coil section 72 and transmit/receive coil section 74. When conductive rods 84 or rod extensions 64 are switched in by PIN diodes 88 in this manner, the effective length of coil section 74 can be extended to thereby define a further array volume. PIN diodes 88 are forward biased and the length of coil section 74 is thereby extended in this manner when electrical energy is applied to outer coil 68 for the purpose of creating a magnetic field to form a magnetic resonance image. Although PIN diodes 88 can be used in the preferred embodiment for extending the length of outer coil 68, any kind of coupling and decoupling circuit known to those skilled in the art can be used.

It will be understood that coil array system 60 can be used for left or right imaging of the musculoskeletal system of human subjects. For example, coil array system 60 can be used for imaging a knee, a foot, an ankle, a wrist or a hand. The anatomical structures that can be imaged and evaluated using coil array system 60 can include ligaments. tendons, cartilage, osseous structures, fluid filled bursa, adipose tissue, muscle and potential pathological lesions. Furthermore, coil array system 60 is adapted to permit easy placement of the anatomy of interest Within the array volume defined by coils 62, 64 and adapted to be disposed on a base to permit positioning left and right of isocenter.

Figure 5:
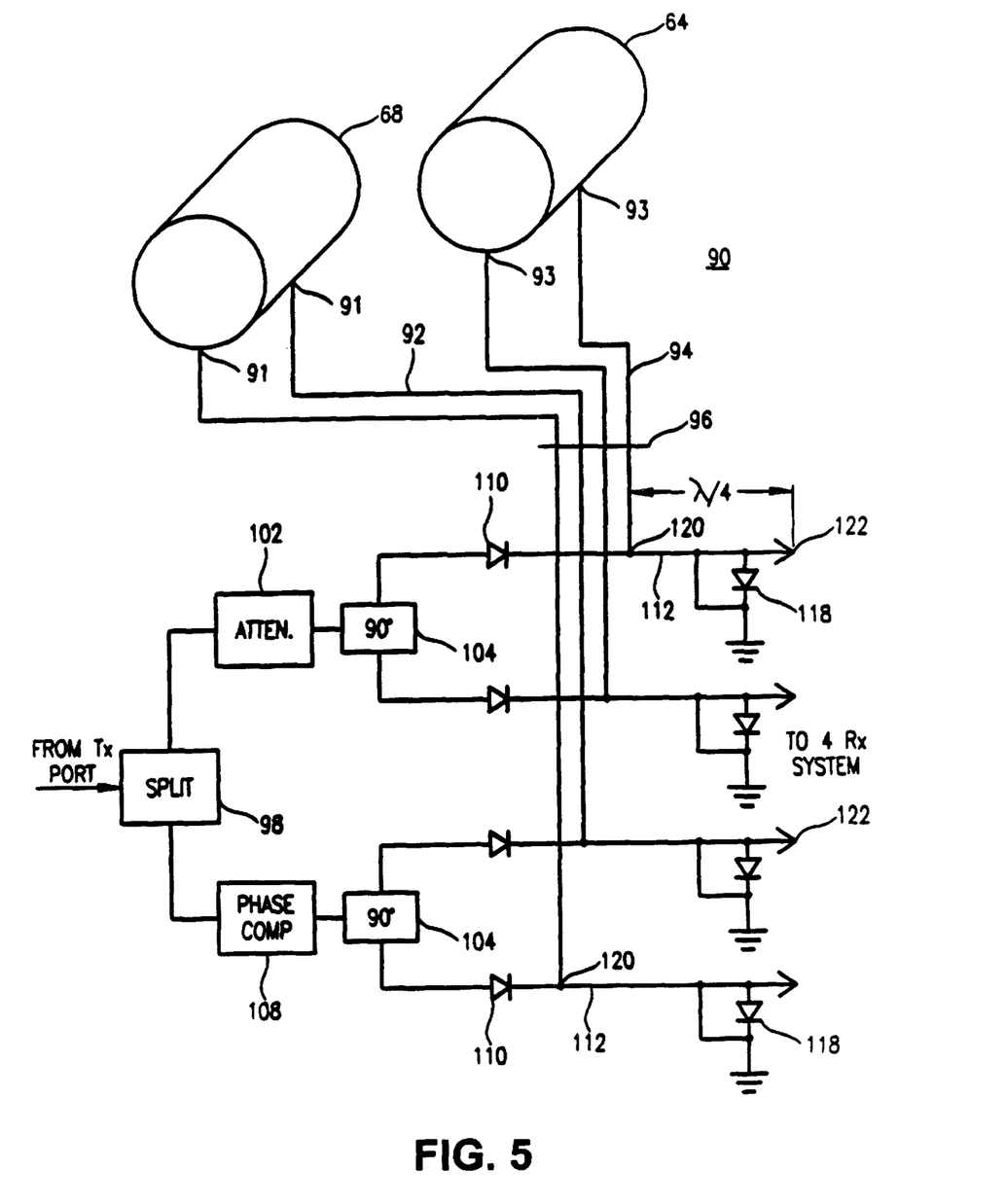
FIG. 5 is a schematic diagram of a second preferred embodiment of the present invention illustrating possible electrical connections that can be made to the multiple quadrature receiver/transmitter coil system.

Referring now to FIG. 5 there is shown a second preferred embodiment of the present invention including a coil interface subsystem 90 coupled to coils 64, 68. The subsystem 90 applies energy to extended transmit/receive coils 64, 68 and receives the output of coils 64, 68 to form images of selected regions of interest. Within subsystem 90 electrical energy is received from a conventional transmitter port by splitter 98 for the purpose of applying a magnetic field to the region of interest by coil 64, coil 68 or both.

Energy from splitter 98 is applied to phase compensator 108 to obtain the correct phase relationship between the fields of coils 64, 68. The output of phase compensator 108 is applied to a ninety degree element 104. The outputs of the ninety degree element 104 are applied to isolated contact points 91, displaced ninety degrees from each other, by way of leads 92 and socket 96. Disposing contact points 91 it ninety degrees with respect to each other causes the orthogonal component of the rotating magnetic field signal to be completely received within coil system 64, 68.

Because the energy required by larger coil 68 may be more than the energy required by smaller coil 64, the energy, supply path of smaller coil 64 is provided with attenuator 102 at the output of splitter 98. Additionally, a ninety degree element 104 is provided as previously described. The four outputs of the ninety degree elements 104 thus determine relative amplitudes and phases for driving the inputs of coil system 64, 68 with the appropriate power levels and signal phases to provide the most uniform transmit field possible. Energy from the outputs of the ninety degree element 104 is applied to coil 64 at contact points 93 by way of socket 96 and connectors 94. Contact points 93 are disposed ninety degrees from each other as described with respect to contact points 91. In this manner coil system 64, 68 is provided with two quadrature pairs separated spatially along the Z-axis. Additionally the voltage level and the phase applied to coils 64, 68 can be adjusted to provide a uniform field. Coils 64 and 68 can be crossed saddle quadrature coils or Helmholtz pairs.

It will be understood that alternate arrangements of attenuation and phase compensation can be used to obtain the required results. For example, both the attenuation and the phase compensation can be applied to one of the coils 64, 68 without any additional attenuation or phase compensation being applied to the other coil 64, 68. For example, the attenuation and phase compensation can be applied to the path of inner coil 64 only. Furthermore, if inner coil 64 serves as a receive only coil without serving as a transmit coil, then transmit power is applied only to outer coil 68. In this case the transmit power can be applied to contact points 91 by way of a ninety degree element without necessarily using any additional attenuation or phase compensation. Further in this case inner coil 64 does not require transmit decoupling.

Figure 6:
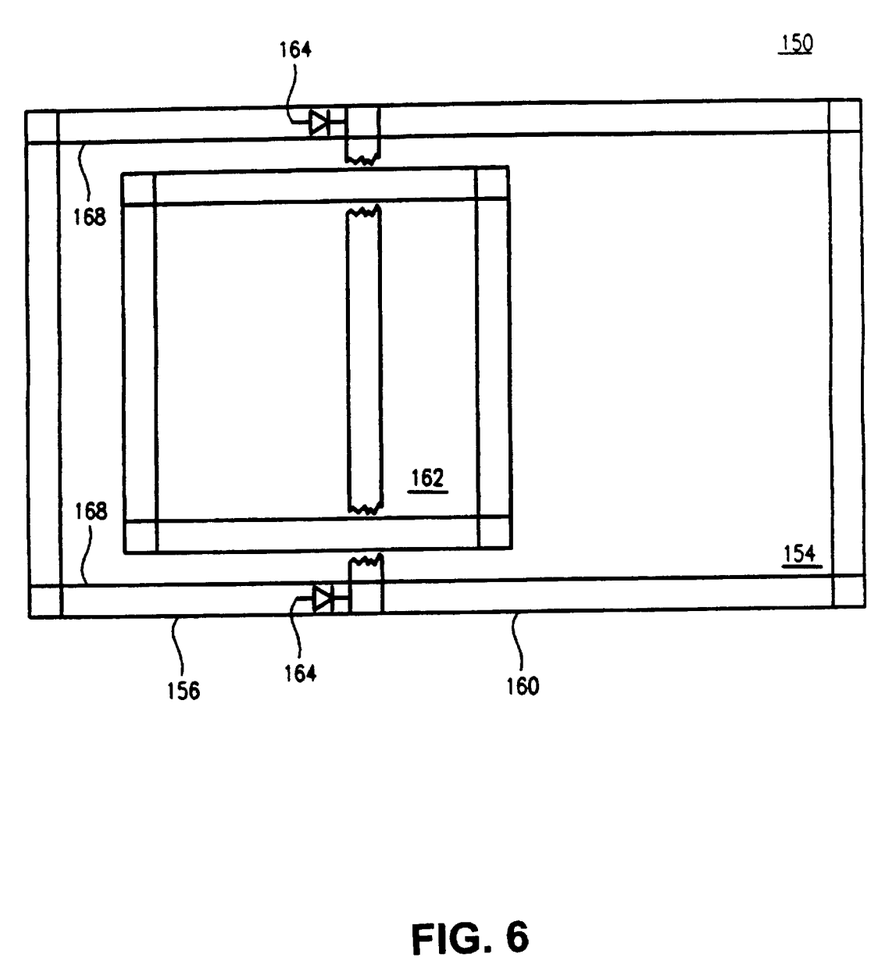
FIG. 6 is a side view similar to FIG. 4 of the preferred embodiment of the multiple quadrature receiver/transmitter coil system of the present invention.

Referring now to FIG. 6, there is shown a side view of magnetic receiver/transmitter coil array system 150 of the present invention. Magnetic receiver/transmitter coil array system 150 is a preferred embodiment of the system of the present invention. Outer quadrature coil 154 and inner quadrature coil 162 are provided within magnetic receiver/ transmitter coil array system 150 for performing substantially similar operations as those described with respect to coil array system 60.

For example, outer quadrature coil 154 is formed of coil sections 156, 160 wherein conductor rods 168 of coil section 156 are provided with PIN diodes 164. When PIN diodes 164 of coil section 156 are forward biased during transmission the effective length of outer quadrature coil 154 is extended to be equal to the combined lengths of coil section 156 and coil section 160.

Each of the conductive rods 66, 82 and 84 of coil array system 60 can be provided with an adjustable tuning capacitor located at its mechanical center. The use of tuning capacitors in this manner is well known in the art and is not shown in order to simplify the drawings. The value of the tuning capacitors can be selected to allow each conductive rod 66, 82 and 84 to resonate at 63.87 MHz. A variable capacitor can be provided between the conductive rods containing the output contacts 91, 93. The additional variable capacitor can be used to optimize the isolation of the quadrature outputs.

A network for impedance matching the real part of the coil impedance to 50 Ω through the two lattice baluns can be provided for each of the four conductive rods 66, 74 having contacts 91,93. This can be accomplished using a series capacitive divider and an impedance transformation in the baluns. Additionally, each output port 122 can be followed by a balancing network including two series connected lattice baluns that are resonant at 63.87 MHz.

With respect to FIG. 5, output lines 112 apply signals from coils 64, 68 to output ports 122 that can be coupled to a conventional four receiver (i.e., data acquisition) system. The physical length of output lines 112 is approximately 37 inches from its junction 120 to the receiver, corresponding electrically to ¼ wavelength. In the preferred embodiment each output port 122 has PIN diode 118 coupled to output line 112. PIN diodes 118 act as switches to connect coils 64, 68 to the receiver system during data acquisition and to disconnect the receiver system from the transmit port during the transmit stage.

Figure 7:
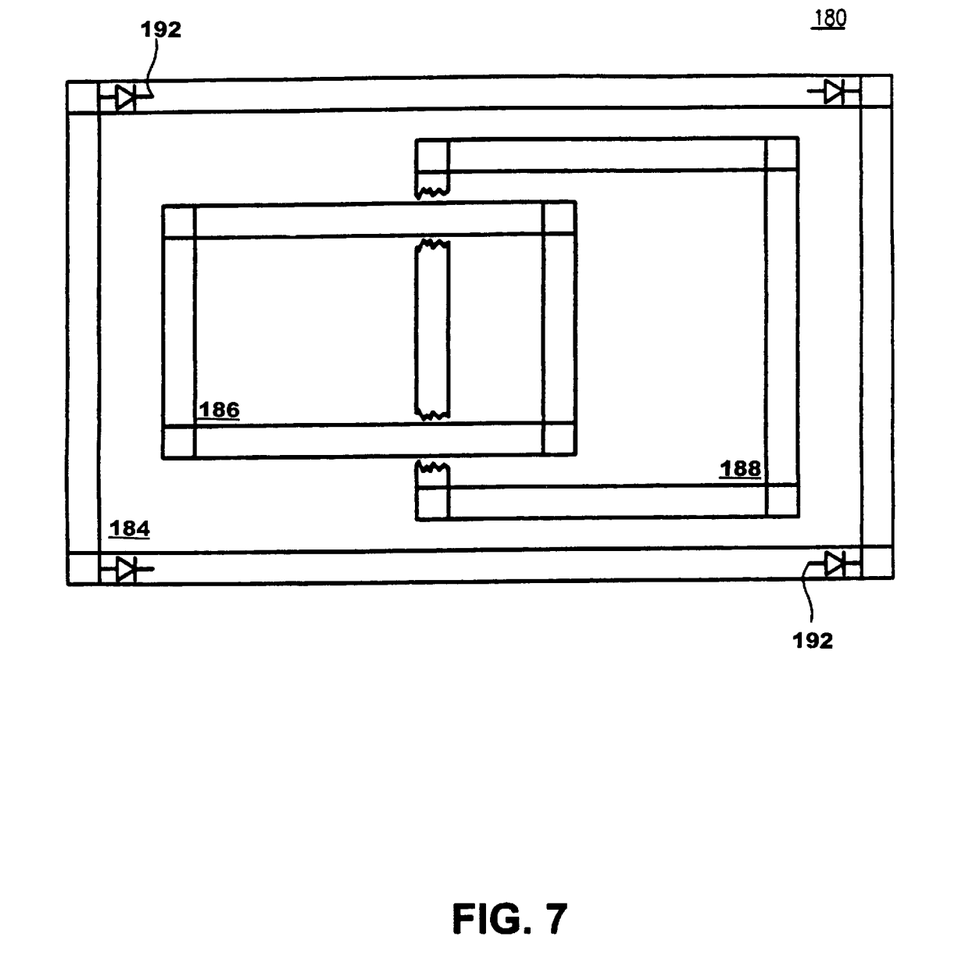
FIG. 7 is a side view of a further preferred embodiment of the multiple quadrature receiver/transmitter coil system of the present invention.

Referring now to FIG. 7, there is shown magnetic receiver/transmitter coil array system 180. Magnetic receiver/transmitter coil array system 180 is a preferred embodiment of the system of the present invention that includes outer coil element 184 and inner coil elements 186, 188. In the embodiment of FIG. 7 inner coil elements 186, 188 function as both receive elements and transmit elements. Excitation can be applied to inner coil elements 186, 188 by means of inductive coupling from external loops added to the coil. For example, four such loops can be used to excite a quadrature field in each of inner coil elements 186, 188.

As previously described with respect to coil system 60, splitters 104 can be used to provide four outputs of a selectively determined relative amplitude and phase to drive the four loops added to the current coil design with the appropriate power levels and signal phases to provide the most uniform transmit field possible. PIN diode networks 192 can be used to isolate the coil elements from the coil during transmission.

Thus quadrature receiving coil system 60 and its alternate embodiments provide an improvement over previous receiving coils when multiple means for processing image signals are available. The sensitive volume of the coil system is expanded allowing for the interception of both quadrature components of MRI signals in a spatially dependent manner, with each coil providing coverage of a portion of the desired sensitive volume along the axis parallel to the main magnetic field. Consequently, each coil had a sensitive volume smaller than that which would otherwise be necessary and each such coil provided improved signal to noise ratio from the region within its sensitive volume.

The above description is intended by way of example only and is not intended to limit the present invention in any way, except as set forth in the following claims. For example, it is to be understood that the present invention is not limited to two coil systems. Rather, the present invention may be embodied as an N-quadrature coil system, where N is an integer, and where N processing means are available for each coil system. Furthermore the present invention can include any method and system for adding transmit capability to a quadrature phased array coil element by extending one part of the coil in transmit only, transmitting with both coils with proper amplitude and phase, and using external local transmit coil elements.

What is claimed is:

1. A magnetic resonance imaging system for forming images of a region of interest, comprising:
    a first phased array coil formed of a plurality of electrically conductive members and defining a first array volume;
    a second phased array coil formed of a second plurality of electrically conductive members and defining a second array volume, said second phased array coil disposed at least partially within the first array volume, said first and second phase array coils cooperating to define a coil subsystem; and
    a coil interface subsystem operably coupled to the coil subsystem, said coil interface subsystem, in a first selectable state, processing RF power such that a substantially uniform first magnetic field is applied to the region of interest, and, in a second selectable state, receiving a response of the region of interest to the first magnetic field.

2. The magnetic resonance imaging system of claim 1 wherein said coil interface subsystem processes and directs the RF power, in the first selectable state, to (i) said first phased array coil or said second phased array coil or (ii) said first phased array coil and said second phased array coil.

3. The magnetic resonance imaging system of claim 2 wherein said coil interface subsystem splits and phase-shifts the RF power to produce coil-exciting signals for delivery to the coil subsystem.

4. The magnetic resonance imaging system of claim 3 wherein said coil interface subsystem is coupled, in the first selectable state, to said first phased array coil, the coil-exciting signals including at least first and second coil signals for delivery to said first phased array coil, the second coil signal being phase-shifted with respect to the first coil signal.

5. The magnetic resonance imaging system of claim 3 wherein said coil interface subsystem is coupled, in the first selectable state, to said second phased array coil, the coil-exciting signals including at least first and second coil signals for delivery to said second phased array coil, the second coil signal being phase-shifted with respect to the first coil signal.

6. The magnetic resonance imaging system of claim 3 wherein said coil interface subsystem is coupled, in the first selectable state, to said first and second phased array coils, said coil interface subsystem selectively attenuating the coil-exciting signals to produce first, second, third and fourth coil signals, the first and second coil signals being delivered to said first phased array coil, the second coil signal being phase-shifted with respect to the first coil signal, the third and fourth coil signals being delivered to said second phased array coil, the fourth coil signal being phase-shifted with respect to the third coil signal, the third and fourth coil signals being attenuated with respect to the first and second coil signals.

7. The magnetic resonance imaging system of claim 1 wherein said second phased array coil is disposed completely within the first array volume.

8. The magnetic resonance imaging system of claim 7 wherein said coil interface subsystem processes and directs RF power, in the first selectable state, to (i) said first phased array coil or said second phased array coil or (ii) said first phased array coil and said second phased array coil.

9. The magnetic resonance imaging system of claim 8 wherein said coil interface subsystem splits and phase-shifts the RF power to produce coil-exciting signals for delivery to the coil subsystem.

10. The magnetic resonance imaging system of claim 9 wherein said coil interface subsystem is coupled, in the first selectable state, to said first phased array coil, the coil-exciting signals including at least first and second coil signals for delivery to said first phased array coil, the second coil signal being phase-shifted with respect to the first coil signal.

11. The magnetic resonance imaging system of claim 9 wherein said coil interface subsystem is coupled, in the first selectable state, to said second phased array coil, the coil-exciting signals including at least first and second coil signals for delivery to said second phased array coil, the second coil signal being phase-shifted with respect to the first coil signal.

12. The magnetic resonance imaging system of claim 9 wherein said coil interface subsystem is coupled, in the first selectable state, to said first and second phased array coils, said coil interface subsystem selectively attenuating the coil-exciting signals to produce first, second, third and fourth coil signals, the first and second coil signals being delivered to said first phased array coil, the second coil signal being phase-shifted with respect to the first coil signal, the third and fourth coil signals being delivered to said second phased array coil, the fourth coil signal being phase-shifted with respect to the third coil signal, the third and fourth coil signals being attenuated with respect to the first and second coil signals.

13. The magnetic resonance imaging system of claim 1, further comprising an extension element operably associated with and extending said first phased array coil to define a further array volume, said second phased array coil being disposed completely within the first array volume and the further array volume.

14. The magnetic resonance imaging system of claim 1 wherein at least one of said first and second phased array coils is a volume coil.

15. The magnetic resonance imaging system of claim 1 wherein both of the first and second phased array coils are volume coils.

16. A method of forming magnetic resonance images of a region of interest of a patient, the method comprising:
   positioning a coil subsystem in proximity to the region of interest, the coil subsystem comprising a first phased array coil formed of a plurality of electrically conductive members and defining a first array volume and a second phased array coil formed of a second plurality of electrically conductive members and defining a second array volume, the second phased array coil disposed at least partially within the first array volume;
   applying a substantially uniform first magnetic field to the region of interest through the coil subsystem; and
   receiving a response of the region of interest to the first magnetic field.

17. The method of claim 16, further comprising:
   operably coupling a coil interface subsystem to the coil subsystem;
   processing RF power with the coil interface subsystem;
   in a first selectable state of the coil interface subsystem, directing the processed RF power to the coil subsystem so as to apply the substantially uniform first magnetic field to the region of interest; and
   in a second selectable state of the coil interface subsystem, receiving an output representative of the magnetic response.

18. The method of claim 17 wherein the processing step comprises directing RF power, in the first selectable state, to (i) the first phased array coil or the second phased array coil or (ii) the first phased array coil and the second phased array coil.

19. The method of claim 18 wherein the processing step comprises splitting and phase-shifting the RF power to produce coil-exciting signals for delivery to the coil subsystem.

20. The method of claim 19 wherein the coil interface subsystem is coupled, in the first selectable state, to the first phased array coil, the coil-exciting signals including at least first and second coil signals for delivery to the first phased array coil, the second coil signal being phase-shifted with respect to the first coil signal.

21. The method of claim 19 wherein the coil interface subsystem is coupled, in the first selectable state, to the second phased array coil, the coil-exciting signals including at least first and second coil signals for delivery to the second phased array coil, the second coil signal being phase-shifted with respect to the first coil signal.

22. The method of claim 19 wherein the coil interface subsystem is coupled, in the first selectable state, to the first and second phased array coils, the coil interface subsystem selectively attenuating the coil-exciting signals to produce first, second, third and fourth coil signals, the first and second coil signals being delivered to the first phased array coil, the second coil signal being phase-shifted with respect to the first coil signal, the third and fourth coil signals being delivered to the second phased array coil, the fourth coil signal being phase-shifted with respect to the third coil signal, the third and fourth coil signals being attenuated with respect to the first and second coil signals.

23. A method of forming magnetic resonance images of a region of interest of a patient, the method comprising:
   positioning a first phased array coil, formed of a plurality of electrically conductive members and defining a first array volume, in proximity to the region of interest;
   positioning a second phased array coil, formed of a second plurality of electrically conductive members and defining a second array volume, at least partially within the first array volume, said first and second phased array coils defining a coil subsystem;
   applying a substantially uniform first magnetic field to the region of interest through (i) the first phased array coil or the second phase array coil or (ii) the first phased array coil and the second phased array coil; and
   receiving a response of the region of interest to the first magnetic field.

24. A magnetic resonance imaging system for forming images of a region of interest, comprising:
   a first phased array coil formed of a plurality of electrically conductive members and defining a first array volume;
   a second phased array coil formed of a second plurality of electrically conductive members and defining a second array volume, said second phased array coil disposed at least partially within said first array volume; and
   an outer coil adapted to substantially encompass said first phased array coil and said second phased array coil, whereby excitation of said outer coil is inductively coupled to said first phased array coil and said second phased array coil.

25. The magnetic resonance imaging system of claim 24 wherein said outer coil is operable to apply a substantially uniform first magnetic field to region of interest within the first and second array volumes and said first and second phased array coils are operable to receive a second magnetic field generated by the region of interest in response to the first magnetic field.

* * * * *

UNITED STATES PATENT AND TRADEMARK OFFICE
CERTIFICATE OF CORRECTION

PATENT NO.    : 6,396,273 B2
DATED         : May 28, 2002
INVENTOR(S)   : Misic, George J.

It is certified that error appears in the above-identified patent and that said Letters Patent is hereby corrected as shown below:

<u>Title page,</u>
Item [57], ABSTRACT,
Lines 3, 5, 11, 14 and 16, after each instance of "phased array" insert -- coil --.
Line 6, after "members" insert -- and defining a second array volume --.
Line 8, after "to apply a" insert -- substantially uniform --.
Lines 8 and 10, replace each instance of "arrays" with -- array coils --.
Line 9, replace "volume" with -- volumes --.
Line 11, replace "The first" with -- In one embodiment, the first --.

<u>Column 2,</u>
Lines 46 and 48, delete "element".
Line 49, after "members" insert -- and defining a second array volume --.
Lines 51 and 53, replace each instance of "arrays" with -- array coils --.
Line 52, after "to apply a" insert -- substantially uniform --.
Line 52, replace "volume" with -- volumes --.
Line 54, replace "The first" with -- In one embodiment, the first --.
Lines 55, 58 and 59, after each instance of "phased array" insert -- coil --.

Signed and Sealed this

Sixteenth Day of September, 2003

JAMES E. ROGAN
*Director of the United States Patent and Trademark Office*